United States Patent
Yi et al.

(10) Patent No.: US 6,232,189 B1
(45) Date of Patent: May 15, 2001

(54) MANUFACTURING METHOD OF SEMICONDUCTOR DEVICE

(75) Inventors: Sang-don Yi, Seoul; Jong-hyon Ahn, Kyungki-do; Soo-cheol Lee, Seoul, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/441,187

(22) Filed: Nov. 15, 1999

(30) Foreign Application Priority Data

Jun. 11, 1999 (KR) .................................................. 99-21751

(51) Int. Cl.$^7$ .................................................. H01L 21/336
(52) U.S. Cl. ............................................ 438/301; 438/291
(58) Field of Search .................................... 438/291, 301, 438/305, 545, 595, 308, 303, 217, 290, 596, 519, 149, 153, 501, 502, 506, 508, 509, 514

(56) References Cited

U.S. PATENT DOCUMENTS

| | | | |
|---|---|---|---|
| 5,270,226 | * 12/1993 | Hori et al. | 438/302 |
| 5,759,901 | * 6/1998 | Loh et al. | 438/305 |
| 5,804,496 | * 9/1998 | Duane | 438/520 |
| 6,080,630 | * 6/2000 | Milic-Strkalj et al. | 438/305 |

FOREIGN PATENT DOCUMENTS

0123456 A2 * 1/2000 (EP) .

* cited by examiner

Primary Examiner—David Nelms
Assistant Examiner—David Nhu
(74) Attorney, Agent, or Firm—Myers Bigel Sibley & Sajovec

(57) ABSTRACT

A manufacturing method of semiconductor devices in which sources and drains define effective channels having lengths which are essentially equal to target length is disclosed. The method includes the steps of forming a gate electrode on a semiconductor substrate, measuring a length of the gate electrode, calculating a lateral diffusion distance using the measured length of the gate electrode and a length of a target effective channel, determining implantation conditions for forming a source and drain having the lateral diffusion distance, and forming the source and drain, by ion implanting in accordance with the implantation conditions. Even though the length of the gate electrode is changed in accordance with a change of the process conditions, sources and drains defining effective channels of a target length can be formed. Also, the manufacturing method can be used for two or more semiconductor substrates so that semiconductor devices formed on the two or more semiconductor substrates have sources and drains defining effective channels having the same lengths.

13 Claims, 5 Drawing Sheets

$a1 < a2 < a3$
$b1 < b2 < b3$
$c1 = c2 = c3$

MANUFACTURING METHOD OF SEMICONDUCTOR DEVICE

BACKGROUND OF THE INVENTION

1. Field of the Invention

The present invention relates to a method of manufacturing semiconductor devices, and more particularly, to a method of manufacturing semiconductor devices having an effective channel of a target length.

2. Description of the Related Art

As the integration of semiconductor devices increases, their size becomes smaller. As a result, techniques for finely processing the same have been developed in the manufacturing process of semiconductor devices. Here, a photolithography process is a basic process for manufacturing semiconductor devices. The photolithography process greatly depends on materials or devices. In particular, when the photolithography process for forming a gate electrode of a transistor is performed, the length of the gate electrode can change by tens of nanometers in accordance with process conditions.

In the conventional art, a gate electrode composed of a gate insulating layer and a gate conductive layer is formed on a semiconductor substrate, and then a lightly-doped source and drain are formed by implantation using the gate electrode as a mask under conditions determined before manufacturing of the semiconductor device. When implantation for forming a source and drain is performed, implanted dopants are laterally diffused to the down-direction of the gate electrode. As a result, the length of the effective channel which is defined by the source and drain is reduced. Thus, the length of the channel which is formed under the gate electrode is determined by the length of the gate electrode and the lateral diffusion length of implanted dopants.

However, when the gate electrode is formed by photolithography, the length of the gate electrode typically varies in the order tens of nanometers depending on the process conditions. Even though the length of the gate electrode, the source and drain are implanted in accordance with implantation conditions which are determined before the process, so that the lateral diffusion length of implanted dopants are constant. Thus, the length of the effective channel formed under the gate electrode is proportional to the length of the gate electrode. That is, when devices are manufactured by conventional methods of semiconductor devices manufacturing, the length of the gate electrode is changed by conditions of the photolithography process and thus the length of the effective channel is changed.

However, when the length of the formed gate electrode is shorter than a target length, the length of the effective channel formed under the gate electrode becomes short to thereby deteriorate the yield rate. When the length of the formed gate electrode is longer than that of the target gate electrode, the length of the effective channel becomes long, thereby deteriorating the operational speed of the device.

SUMMARY OF THE INVENTION

To solve the above problems, it is an objective of the present invention to provide a manufacturing method of semiconductor devices by which an effective channel of a target length is formed even though the length of the gate electrode varies depending on a change in process conditions, to thereby suppress reduction in the yield or operational speeds of devices.

Accordingly, to achieve the above objective, by the manufacturing method of semiconductor devices, a semiconductor substrate where a gate electrode is formed is provided. Then, two or more measurement points where densities of the gate pattern are different are set, and then the lengths of the gate electrodes in the two or more measurement points are measured. A gate electrode length as a reference for determining the implantation conditions is selected from the lengths of two or more measured gate electrodes. At this time, preferably, the length of the gate electrode having the smallest margin of the implantation process is selected from the two or more measured gate electrode lengths. Then, a lateral diffusion distance is calculated using the measured length of the gate electrode and a length of a target effective channel. Subsequently, implantation conditions for the calculated lateral diffusion distance are determined with reference to data of the relationship between the change of the ion implantation conditions and the lateral diffusion distance. Ion implantation is performed in accordance with the determined ion implantation conditions to thereby form the source and drain which define a channel having the target length. At this time, preferably, the ion implantation conditions are implantation energy, implantation angle and the implantation dosage.

According to the present invention, the gate electrode is formed, and then the length of the gate electrode is measured and implantation conditions for forming the source and drain are determined using the measured length of the gate electrode, so that even though the length of the gate electrode varies, a source and drain defining an effective channel having the constant target lengths can be formed.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENTS

This invention may be embodied in many different forms and should bot be construed as limited to the embodiments set forth herein.

Embodiment 1

Figure 1:
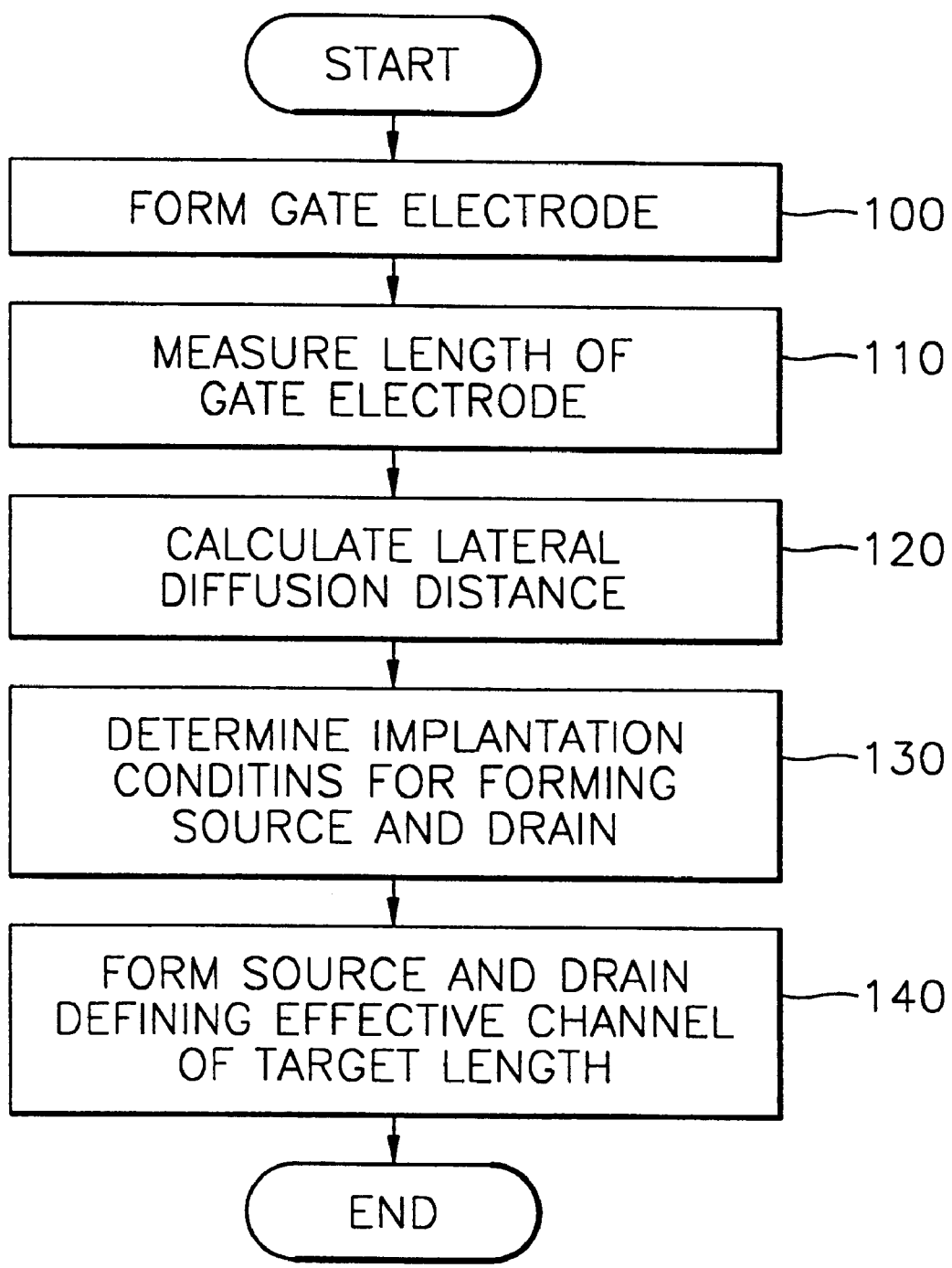
FIG. 1 is a flowchart of a first embodiment of a method of manufacturing semiconductor devices according to the present invention.

Referring to FIG. 1, a gate insulating layer and a gate conductive layer are sequentially formed on a semiconductor substrate, and then patterning is performed using a photolithography process to thereby form a gate electrode composed of the gate insulating layer and the gate conductive layer (step 100). Then, the length of the gate electrode is measured (step 110). Preferably, the gate electrode is measured in two or more points where the gate pattern densities are different. This is for forming a small gate electrode in points where the gate pattern density is high and a great gate electrode in points where the gate pattern density is low, during the photolithography process. If the measuring is performed in a place where gate pattern density is high, an increase in leakage current of the semiconductor device or a reduction in the breakdown voltage can be prevented, but the operational speed of the device is reduced. To overcome the above-described problem, points where the gate pattern densities are high and low, are measured, so that the difference between the maximum gate electrode length and the minimum length thereof can be obtained for a multiplicity of gate electrodes on a chip. Two or more points for measuring are selected, and then gate electrode lengths are measured. Subsequently, a gate electrode length which is a reference for measuring implantation conditions is selected from the lengths of the two or more gate electrodes. It is preferable to select the length of the gate electrode having the smallest margin of the implantation process for forming source and drain.

Then, the lateral diffusion distance is calculated using the measured length of the gate electrode and the length of target effective channel (step 120). The lateral diffusion length is obtained by subtracting the length of target effective channel from the length of the gate electrode. Then, implantation conditions for forming a source and drain capable of obtaining the calculated lateral diffusion distance are determined, with reference to data indicating the relationship between the change of implantation conditions and the lateral diffusion distance (step 130). The implantation conditions are implantation energy, implantation angle or the implantation dosage.

Figure 2:
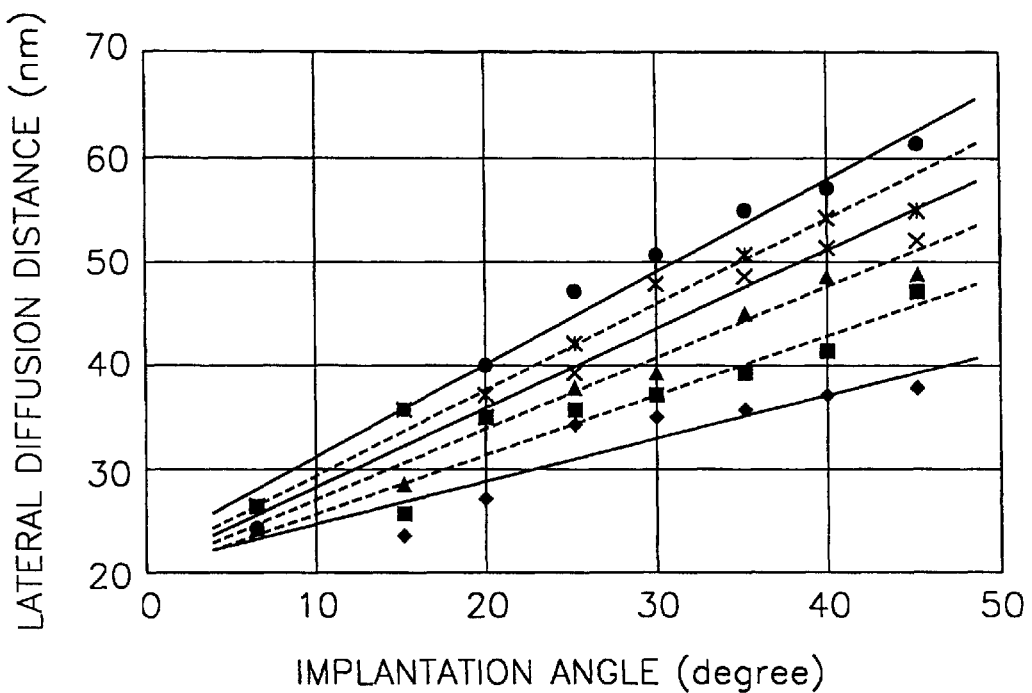
FIG. 2 is a graph of lateral diffusion distance according to changes of an implantation angle during an implantation process.
Figure 3:
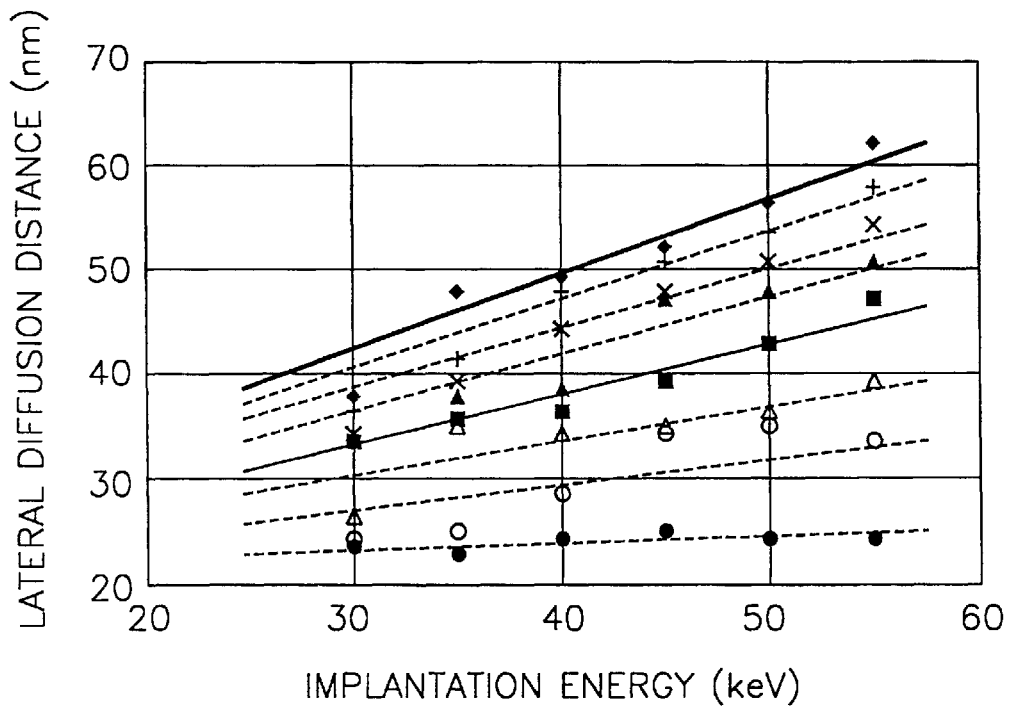
FIG. 3 is a graph of lateral diffusion distance according to changes of implantation energy during an implantation process.
Figure 4:
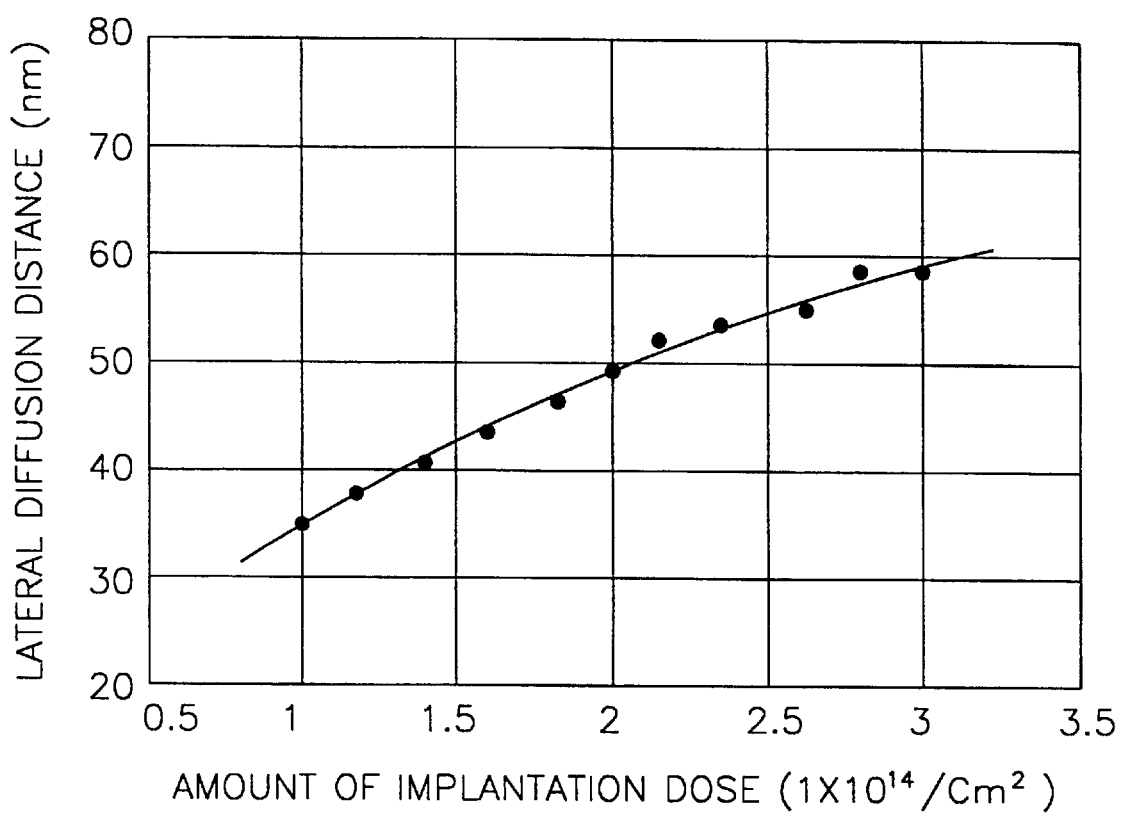
FIG. 4 is a graph of lateral diffusion distance according to changes of the implantation during an implantation process.

FIG. 2 is a graph of a lateral diffusion distance in accordance with the change in implantation angle, where the units of the implantation angle are degrees and the units of lateral diffusion distance are nanometers. In the graph, ♦ indicates the case of implantation energy of 30 KeV, ■ indicates the case of the implantation energy of 35 KeV, ▲ indicates the case of implantation energy of 40 KeV, x indicates the case of the implantation energy of 45 KeV, * indicates the case of implantation energy of 50 KeV, and ● indicates the case of the implantation energy of 55 KeV, respectively. In FIG. 2, when the implantation angle is increased, the lateral diffusion distance proportionally increases. FIG. 3 is a graph of the lateral diffusion distance with respect to the implantation energy, and the unit of implantation energy is KeV. In the graph, reference characters ◇, +, x, ▲, ■, ∆, ○, and ● indicate the cases of an implantation angle of 45°, 40°, 35°, 30°, 25°, 20°, 15° and 7°, respectively. In the graph of FIG. 3, when the implantation energy is increased, the lateral diffusion distance proportionally increases. FIG. 4 is a graph of the lateral diffusion distance with respect to the implantation dosage, and the unit of implantation dosage is $1 \times 10^{14}/cm^2$. In the graph of FIG. 4, when the implantation dosage is increased, the lateral diffusion distance proportionally increases.

A source and drain defining an effective channel of the target length are formed by implantation under implantation conditions determined using a gate electrode as a mask (step 140). In step 140 of forming the source and drain, lightly-doping is preferable. Subsequently, a thick oxide layer is deposited on the entire surface of the resultant structure by chemical vapor deposition (CVD) and then anisotropic-etching is performed, so that gate spacers are formed on the side walls of the gate electrode. Subsequently, a highly-doped source and drain are formed by implantation using the gate spacer and the gate electrode as a mask.

Figure 5A:
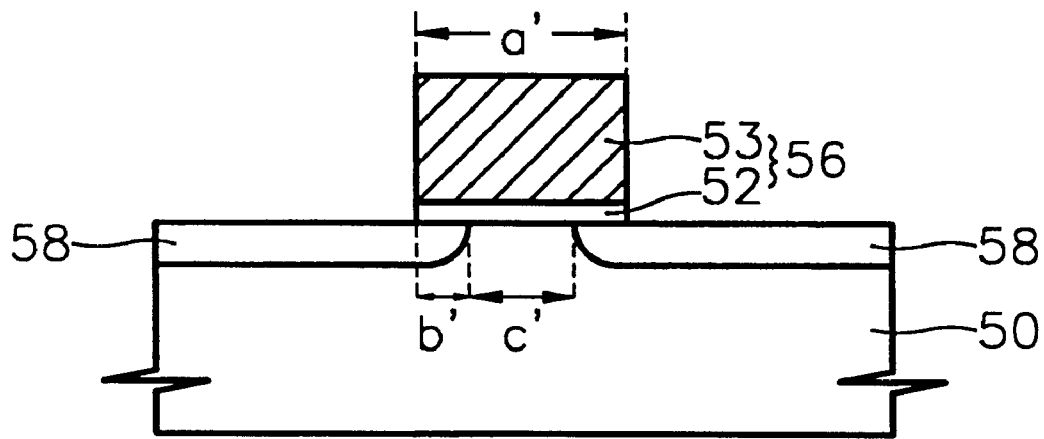
FIGS. 5A through 5B are sectional views of semiconductor devices of an intermediate process formed according to a manufacturing method of the present invention.

Referring to FIG. 5A, a gate electrode 56 composed of a gate insulating layer 52 and a gate conductive layer 53 is formed on a semiconductor substrate 50, and a lightly-doped source and drain 58 are formed. Preferably, implantation conditions for forming the source and drain 58 are determined by the above-described method (step 130 of FIG. 1) with reference to the lateral diffusion distance b' (step 120 of FIG. 1) calculated using the length of the gate electrode a' and the length of target effective channel c'.

Figure 5B:
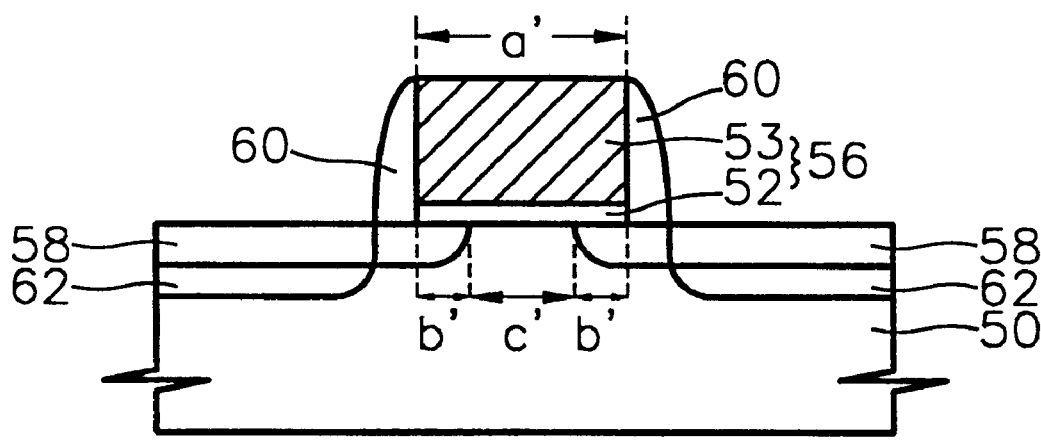

Referring to FIG. 5B, gate spacers 60 are formed on the sidewalls of the gate electrode 56, and a highly-doped source and drain 62 are formed.

Figure 6A:
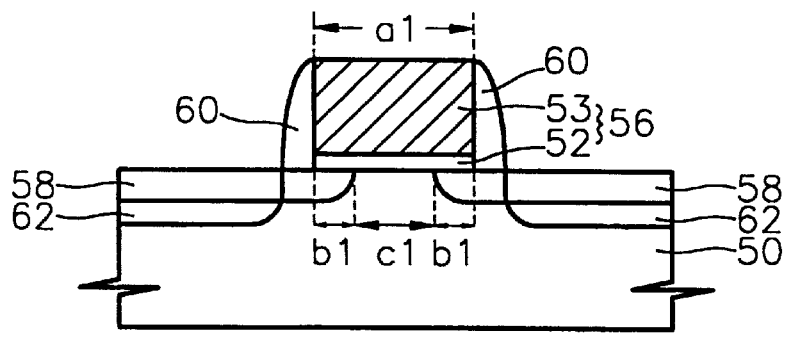
FIGS. 6A through 6C are sectional views of the length of an effective channel in accordance with changes in the length of the gate electrode in a semiconductor device formed according to a manufacturing method of the present invention.
Figure 6B:
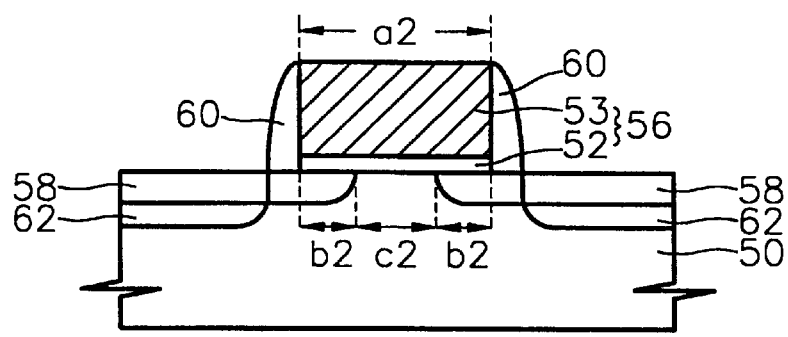
Figure 6C:
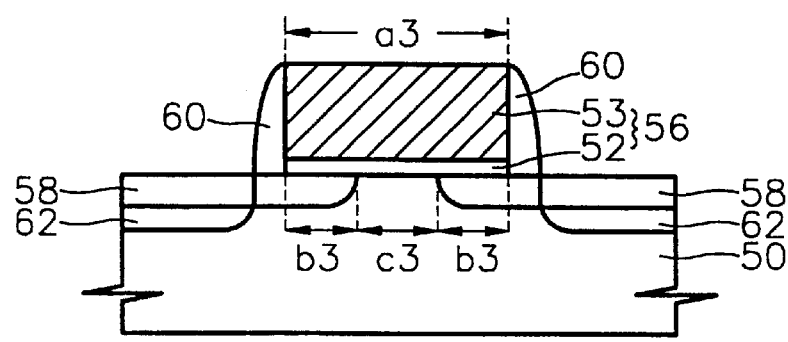

Referring to FIGS. 6A through 6C, when the length of the gate electrode is increased (a1<a2<a3), the lateral diffusion during implantation for forming the source and drain is increased (b1<b2<b3). As a result, even though the length of the gate electrode varies, the length of the effective channel formed under the gate electrode remains constant (c1=c2=c3). That is, even though the length of the gate electrode varies depending on the process conditions, implantation conditions for forming the source and drain are changed, to thereby form a channel having a target length. Also, the manufacturing method according to the present invention is used for two or more semiconductor substrates, so that semiconductor devices manufactured on the two or more semiconductor substrates have channels of the same length.

Embodiment 2

A gate electrode composed of a gate insulating layer and a gate conductive layer is formed on a semiconductor substrate, and then the length of the gate electrode is measured. Then, implantation is performed using the gate electrode as a mask to thereby form a source and drain, and then the lateral diffusion distance is calculated using the length of the measured gate electrode and the length of a target effective channel. Annealing conditions of the semiconductor substrate are determined with reference to the calculated lateral diffusion distance. It is preferable to determine the annealing conditions of the semiconductor substrate with reference to data representing the relationship between the change of annealing conditions and the lateral diffusion distance.

According to the second embodiment of the present invention, even though the length of the gate electrode varies depending on the process conditions, the annealing conditions are appropriately changed, to thereby form a channel having the target length.

According to the method of manufacturing semiconductor devices of the present invention, even though the length of the gate electrode varies depending on changes in the process conditions, the length of the gate electrode is measured so that implantation conditions or annealing conditions are determined to thereby form a source and drain defining an effective channel of a target length. Also, the manufacturing method according to the present invention is used for two or more semiconductor substrates, so that semiconductor devices manufactured on the two or more semiconductor substrates have a source and drain defining the effective channel of the same length.

What is claimed is:

1. A manufacturing method of semiconductor devices, comprising steps of:
   providing a semiconductor substrate where a gate electrode is formed;
   measuring a length of the gate electrode;
   calculating a desired lateral diffusion distance based on the measured length of the gate electrode and a target effective channel length;
   then determining implantation conditions for forming a source and drain based on the desired lateral diffusion distance; and
   forming the source and drain which define a channel having the target effective channel length, by ion implanting in accordance with the implantation conditions using the gate electrode as a mask.

2. The manufacturing method of claim 1, wherein the step of measuring the length of the gate electrode includes the sub-steps of setting two or more measurement points in the semiconductor substrate, measuring the lengths of the gate electrodes in the two or more measurement points, and selecting a gate electrode length as a referenced for determining the implantation conditions from the lengths of two or more measured gate electrodes.

3. The manufacturing method of claim 2, wherein during the step of selecting the length of the gate electrode as a reference for determining the implantation conditions, the gate electrode length having the smallest margin of the implantation process is selected from the two or more measured gate electrode lengths.

4. The manufacturing method of claim 2, wherein the two or more measurement points are set such that the densities of the gate patterns are different.

5. The manufacturing method of claim 1, wherein in the step of determining implantation conditions for forming the source and drain, implantation conditions for the calculated lateral diffusion distance are determined with reference to data representing the relationship between a changes in the implantation conditions and the lateral diffusion distance.

6. The manufacturing method of claim 1, the implantation conditions are implantation energy, implantation angle and the implantation dosage.

7. The manufacturing method of claim 4, the implantation conditions are implantation energy, implantation angle and the implantation dosage.

8. The manufacturing method of claim 1, wherein the step of forming the source and drain comprises the substeps of forming a lightly-doped source and drain by ion-implanting the gate electrode as a mask, forming gate spacers on the sidewalls of the gate electrode, and forming a heavily-doped source and drain by ion-implanting the gate spacers and the gate electrode, and
   wherein the determined implantation conditions are adopted to the step of forming the lightly-doped source and drain.

9. The manufacturing method of claim 1, wherein the manufacturing method of semiconductor devices is used for two or more semiconductor substrates so that devices formed on the two or more semiconductor substrates have sources and drains which define channels having lengths which remain constant.

10. A manufacturing method of semiconductor devices, comprising steps of:
    providing a semiconductor substrate where a gate electrode is formed;
    measuring a length of the gate electrode;
    forming a source and a drain by implanting based on the gate electrode as a mask;
    calculating a desired lateral diffusion distance based on the measured length of the gate electrode and a target effective channel length;
    then determining annealing conditions for annealing the semiconductor substrate based on the desired lateral diffusion distance calculated in the preceding step; and
    performing the annealing in accordance with the annealing conditions to form the channel having the target effective channel length.

11. The manufacturing method of claim 10, wherein in the step of determining the conditions for annealing the semiconductor substrate, the conditions of annealing for forming the source and drain regions having a calculated lateral diffusion distance with reference to data representing the relationship between a change of the annealing conditions and the lateral diffusion distance.

12. A method of manufacturing a field effect transistor having a gate electrode with a length that varies during processing thereof, comprising:
    providing an integrated circuit substrate having a gate electrode formed thereon;
    setting a target-effective channel-length between source and drain regions;
    measuring a final gate electrode length after forming the gate electrode;
    calculating desired lateral diffusion distances of the source and drain regions that provide the target-effective channel-length based on the final gate electrode length, wherein the target-effective channel-length is equal to the difference between the final gate electrode length and the desired lateral diffusion distances of the source and drain regions;
    then determining implantation conditions that will provide the desired lateral diffusion distances of the source and drain regions determined in the preceding calculating step; and
    implanting ions according to the implantation conditions to form source and drain regions spaced apart by the target-effective channel-length.

13. A method of manufacturing a field effect transistor having a gate electrode with a length that varies during processing thereof, comprising:
    providing an integrated circuit substrate having a gate electrode formed thereon;
    setting a target-effective channel-length between source and drain regions;
    measuring a final gate electrode length after forming the gate electrode;
    implanting ions to form source and drain regions in the integrated circuit substrate;
    calculating desired lateral diffusion distances of the source and drain regions that provide the target-effective channel-length based on the final gate electrode length, wherein the target-effective channel-length is equal to the difference between the final gate electrode length and the desired lateral diffusion distances of the source and drain regions;
    then determining annealing conditions for annealing the integrated circuit substrate that will provide the desired lateral diffusion distances of the source and drain regions determined in the preceding calculating step; and
    annealing the integrated circuit substrate in accordance with the annealing conditions determined in the preceding step to form the channel having the target effective channel length.

* * * * *